United States Patent [19]
Lee et al.

[11] Patent Number: 6,025,599
[45] Date of Patent: Feb. 15, 2000

[54] IMAGE CAPTURE ELEMENT

[75] Inventors: Denny L. Y. Lee, West Chester; Lawrence K. Cheung, Berwyn, both of Pa.; Lothar S. Jeromin, Newark, Del.

[73] Assignee: Direct Radiography Corp., Newark, Del.

[21] Appl. No.: 08/987,485

[22] Filed: Dec. 9, 1997

[51] Int. Cl.$^7$ ............................ H01L 27/146; G01T 1/24
[52] U.S. Cl. ........................... 250/370.09; 250/370.14
[58] Field of Search ........................... 250/370.09, 370.14; 257/428, 448, 59, 72

[56] References Cited

U.S. PATENT DOCUMENTS

| | | | |
|---|---|---|---|
| 2,753,278 | 7/1956 | Bixby et al. | 117/200 |
| 4,413,280 | 11/1983 | Adlerstein et al. | 358/111 |
| 4,810,881 | 3/1989 | Berger et al. | 250/370.01 |
| 4,873,708 | 10/1989 | Cusano et al. | 378/62 |
| 5,127,038 | 6/1992 | Jeromin et al. | 378/28 |
| 5,166,524 | 11/1992 | Lee et al. | 250/327 |
| 5,168,160 | 12/1992 | Jeromin et al. | 250/327.2 |
| 5,254,480 | 10/1993 | Tran | 437/2 |
| 5,313,066 | 5/1994 | Lee et al. | 250/370.09 |
| 5,315,101 | 5/1994 | Hughes et al. | 250/208.1 |
| 5,319,206 | 6/1994 | Lee et al. | 250/370.09 |
| 5,331,179 | 7/1994 | Lee et al. | 250/591 |
| 5,381,014 | 1/1995 | Jeromin et al. | 250/370.09 |
| 5,498,880 | 3/1996 | Lee et al. | 250/580 |
| 5,563,421 | 10/1996 | Lee et al. | 250/580 |
| 5,591,963 | 1/1997 | Takeda et al. | 250/214.1 |
| 5,641,974 | 6/1997 | de Boer et al. | 257/59 |
| 5,648,660 | 7/1997 | Lee et al. | 250/370.09 |
| 5,652,430 | 7/1997 | Lee | 250/370.09 |
| 5,658,186 | 8/1997 | Perrotto et al. | 451/41 |

*Primary Examiner*—Edward P. Westin
*Assistant Examiner*—Richard Hanig
*Attorney, Agent, or Firm*—Ratner & Prestia

[57] ABSTRACT

An X-ray image capture radiation detector for use in digital radiography is disclosed. The radiation detector has, in order, a dielectric substrate, a TFT transistor and a capacitor on the surface of the dielectric substrate, an insulating layer, a photoconductive layer over the insulating layer, a top dielectric layer, and a top conducting layer. The insulating layer prevents any direct charge transfer between the photoconductive layer and the capacitor.

11 Claims, 2 Drawing Sheets

IMAGE CAPTURE ELEMENT

FIELD OF THE INVENTION

This invention relates to medical imaging. In particular, this invention relates to electronic X-ray image capture elements comprising arrays of x-ray detectors for use in digital radiography.

BACKGROUND OF THE INVENTION

Although conventional film-screen X-ray radiography has been successfully used for nearly a century, it still has many deficiencies. The exposure range of the film screen system is limited so that the film can be over- or under-exposed. The exposure display latitude and the contrast of the film are also limited. The film requires wet chemical processing. Not only is chemical processing inconvenient, it also delays access to the image.

Digital radiography provides a solution to the problems of conventional radiography. The useful exposure display latitude attainable from digital image receptors is often superior to film, because the variable window level and contrast display of digital images eliminate the display limitations of the film. Because the image is acquired in digital form, it can be enhanced by software manipulation, readily transferred to remote locations for analysis, and easily stored in digital form. No wet chemical processing is required.

Systems have been developed to capture patterns of X-rays using solid state components, generally using X-ray sensitive phosphors, intensifiers or photoconductive materials, and arrays of microelectronic devices to convert X-ray patterns to electrical signals. These systems involve converting an X-ray image pattern into an array of electrical signals, which are subsequently used to produce a visible display of the X-ray image. Such systems are described in, for example: Jeromin, U.S. Pat. No. 5,168,160; Lee, U.S. Pat. No. 5,319,206; Lee, U.S. Pat. No. 5,331,179; Jeromin, U.S. Pat. No. 5,381,014; Lee, U.S. Pat. No. 5,563,421; Lee, U.S. Pat. No. 5,648,660; and Lee, U.S. Pat. No. 5,652,430; all of which are incorporated herein by reference.

An important consideration in such systems is the signal to noise ratio of the system. As the signal to noise ratio is increased, sharper images can be produced and/or patient dose can be reduced. Thus, there is a continuing need for image capture elements that have an improved signal to noise ratio.

SUMMARY OF THE INVENTION

The invention is a radiation detector for capturing patterns of X-rays, said detector comprising:

a dielectric substrate having a top surface and a bottom surface;

a switching element which is preferably a TFT transistor on the top surface of said dielectric substrate;

a charge storage capacitor also on the top surface of said dielectric substrate, said capacitor having a reference electrode, a first dielectric layer, and a collector electrode connected to said transistor, said collector electrode having a top surface opposite said dielectric substrate;

an insulating layer disposed on said collector electrode top surface, said insulating layer being sufficiently thick to prevent charge transfer between the photoconductive layer and the collector electrode.

a photoconductive layer disposed on said insulating layer;

a top dielectric layer disposed on said photoconductive layer; and a top conducting electrode layer disposed over said top dielectric layer.

In one embodiment of the invention, a plurality of radiation detectors is combined on a support to form an array, or imaging panel. The radiation detector of the invention produces images with improved signal to noise ratios.

In another embodiment of this invention, a plurality of arrays are assembled to form a larger panel.

DETAILED DESCRIPTION OF THE INVENTION

The invention will next be described with reference to the accompanying figures in which same reference numbers indicate same elements in all figures.

The image detection panel includes a plurality of radiation detectors arrayed in rows and columns. Each of the radiation detectors has associated with it a switching element which is typically a field effect transistor (FET), preferably a thin film transistor (TFT), which serves as a switch that, on command from outside, connects a storage capacitor in the radiation detector to an integrating amplifier located outside the array.

Formation of the Image Capture Element

Figure 1:
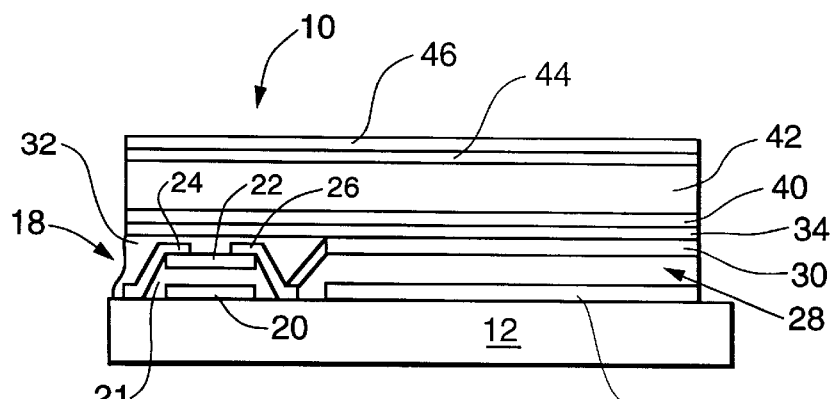
FIG. 1 is a cross-sectional elevation of a radiation detector of the invention.
Figure 3:
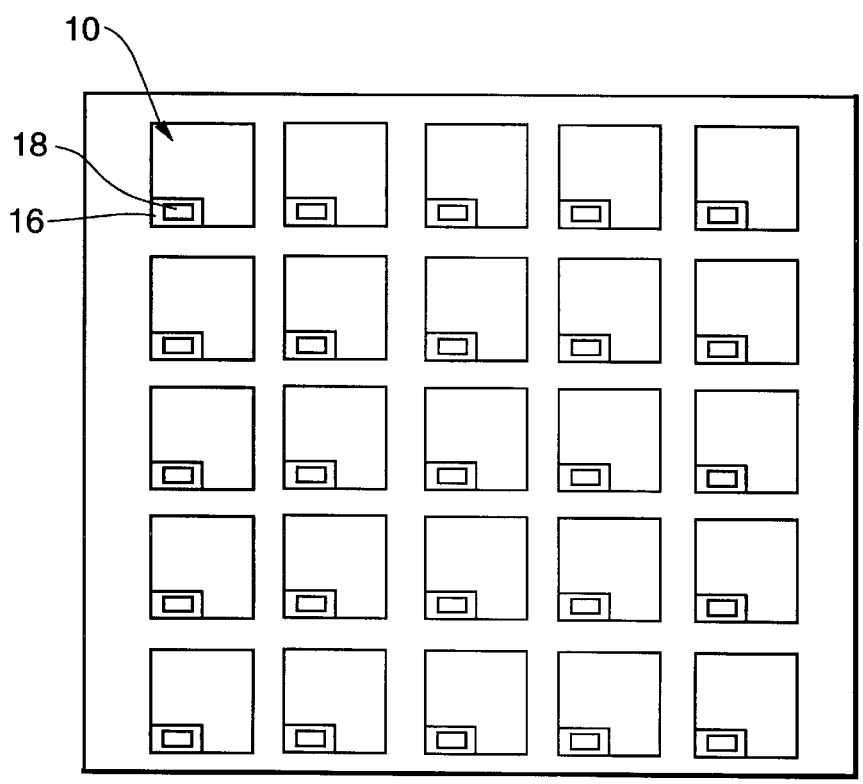
FIG. 3 shows a top view of a plurality of detectors according to the present invention assembled as an array of detectors to form an imaging panel.

FIG. 1 shows a cross-section of the image capture element 10. Each element 10 is formed on a dielectric substrate 12, which is typically made of glass of sufficient thickness to facilitate handling of the element. On substrate 12, there is deposited a first conductive electrode, which is referred to as a reference electrode 14. Reference electrode 14 is generally square with one corner cut off to provide space 16 (better shown in FIG. 3) in which to place the switching element.

In space 16, adjacent to reference electrode 14, a switching element which can be a TFT transistor 18, is built on substrate 12. Transistor 18 preferably comprises a gate electrode 20 deposited on substrate 12. A dielectric material 21 is placed over gate electrode 20. A semiconductor 22, such as amorphous silicon or cadmium selenide, is placed over the dielectric. Source electrode 24 and drain electrode 26 are connected to the semiconductor to complete transistor 18.

First dielectric layer 28 is placed over reference electrode 14. A second electrode 30, parallel and co-extensive with reference electrode 14, is deposited on first dielectric layer 28. Drain 26 of transistor 18 is electrically connected to second electrode 30.

Next, a dielectric layer 32 is placed over transistor 18. A third electrode 34 is deposited over both second electrode 30 and dielectric layer 32. Third electrode 34 is larger than second electrode 30. It occupies a plane parallel to second electrode 30 and extends over space 16 occupied by transistor 18. Third electrode 34 is in electrical contact with second electrode 30, and together the second and third electrodes form a collector electrode.

The collector electrode, first dielectric layer 28 and reference electrode 14 form a capacitor C4.

The technology for the creation of transistors and charge storage capacitors, such as those described herein, is well known. See, for example, "Modular Series on Solid State Devices," Volume 5 of *Introduction to Microelectronics Fabrication*, R. C. Jaeger, Addison-Wesley, 1988, and U. S. Pat. No. 5,641,974 issued Jun. 24 1997 to denBoer et al. and assigned to OIS Optical Imaging Systems, Inc.

Next, an insulating layer 40 is placed over the collector electrode. Numerous dielectric materials are known in the art and can be used to form this layer including Silicon Nitride (SiNx), Silicon Oxy Nitride (SiNxOy), and Silicon Dioxide ($SiO_2$). The layer typically has a thickness of 200 Å to 1000 Å, preferably 500 Å to 800 Å. The layer can be deposited by well-known deposition techniques, such as sputtering or by electron beam vacuum deposition.

The thickness of this insulating layer is controlled by two factors. The layer must be thick enough so that charges, both positive and negative, cannot pass through this layer from the photoconductive layer to the collector electrode of capacitor C4, and vice versa, under the applied electrical field through tunneling. The layer must not be so thick that the voltage appearing on capacitor C3 is a large proportion of the total voltage appearing across both C3 and C4.

The insulating layer 40 may be coextensive with electrode 34 of the collector, or may be a layer which extends beyond the collector electrode. Insulating layer 40 may also be coextensive with the photoconductive layer. In cases where more than one detector is present, as in the case of an imaging panel comprising a plurality of detectors in an array, layer 40 is preferably a continuous layer extending over the detectors.

A photoconductive layer 42 is next coated over second dielectric layer 40. The specific type of material used in photoconductive layer 42 will depend on the desired X-ray absorption efficiency, charge generation efficiency, and charge transport properties. Amorphous selenium and various selenium alloys, such as a selenium-arsenic alloy having about 0.1 to 0.5% by weight arsenic, are preferred X-ray photoconductors. Depending on the application, photoconductive layers of selenium are typically about 100 micrometers to about 1000 micrometers thick. For mammography, the selenium layer is typically 100 micrometers to 150 micrometers thick. For chest X-rays, the selenium layer is typically about 450 micrometers to about 500 micrometers thick. The photoconductive layer is applied using conventional vapor deposition techniques, which are well known to those skilled in the art. Vacuum deposition techniques are described, for example, in *Handbook of Deposition Technologies for Films and Coatings*, 2nd. Ed., R. F. Bunshah, Ed., Noyes Publications, Park Ridge, N.J., 1994. Physical vapor deposition of selenium is described, for example, in Bixby, U.S. Pat. No. 2,753,278.

Unlike previously disclosed radiation detectors, the photoconductive layer is not placed on the collector electrode. The photoconductive layer is separated from the collector electrode by insulating layer 40.

A top dielectric layer 44 is next coated over the photoconductive layer 42. Lamination and a UV-curable adhesive or a wet coating process such as spin, dip or blade coating may be used to form top dielectric layer 44. The top dielectric layer preferably has a thickness greater than 100 Å. Polyethylene terephthalate film having a thickness greater than 10 microns is well suited for use in a lamination process.

Alternatively, any of numerous dielectric materials well known to those skilled in the art, such as acrylate polymers such as poly(methyl methacrylate) or solvent soluble polyimides, can be used and can be applied by a wet, blade coating process. A ago polymer material such a Parylene marketed by Specialty Coating System Inc. can be used for this layer, and can be deposited using vacuum deposition.

Consequently, in the radiation detector of this invention the photoconductive layer is not in contact with a conductor.

Next, a thin layer of conductive material, such as indium-tin oxide, chromium, aluminum, gold, copper or any other conductive material that is transparent to the X-radiation used to form the image, is placed over third dielectric layer 44 to form top electrode 46 of the imaging element. The thin layer of conductive material is deposited using well-known vacuum deposition techniques, such as sputtering or electron beam thermal evaporation. A layer of chromium metal about 150 Å thick can be used.

All layers with the exception of the photoconductive layer are substantially transparent to radiation in the visible spectrum.

Not illustrated in the figures is a blocking layer on the surface of the collector electrode, which may be the result of an oxide of the metal forming on the electrode. Such blocking layers have been occasionally formed intentionally on the collector electrode. The term blocking layer is often used in the art to describe this layer, and is somewhat misleading. This layer does not block the direct transfer of charges between the collector and the photoconductive layer but only serves to control the charge flow between the photoconductor and the collector, typically inhibiting a particular polarity charge from traveling in a particular direction.

Such blocking layers are not intended to, nor do they, isolate the photoconductive layer from the charge storage capacitor inhibiting any charge transfer therebetween. However, such blocking layer may be present in the present invention structure, placed on the collector electrode intentionally, or more likely resulting from the natural oxidation of the surface of the metal electrode depending on the material selected for the electrode. This is particularly true if the metal used is aluminum.

Operation of the Image Capture Sensor

Figure 2:
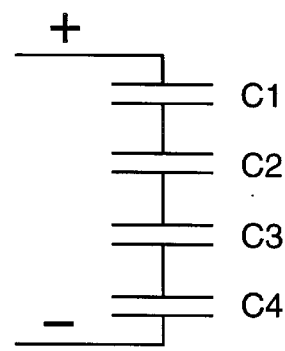
FIG. 2 shows the electrical equivalent of each radiation detector of the invention.

The electrical equivalent of each individual radiation detector is shown in FIG. 2, where the different layers are represented as four capacitors connected in series. C1 is the capacitor formed by top electrode 46, top dielectric layer 44 and the top surface 41 of photoconductive layer 42 in contact with the top dielectric layer. C2 is the capacitor formed by the photoconductive layer 42. C3 is the capacitor formed by the bottom surface 43 of photoconductive layer 42 in contact with the insulating layer 40, and electrode 34. C4 is the capacitor formed by the collector electrode second electrode 30, first dielectric layer 28 and reference electrode 14.

Prior to exposure, a high DC voltage is applied between the reference electrode and the top electrode to provide a biasing electrical field across the radiation detector structure.

The DC voltage is applied gradually to a predetermined level, then held steady. Preferably, during this step, the switching element is turned on and the collector electrode connected to ground. As a result, the applied DC voltage is distributed among capacitors C1, C2, and C3. The voltage appearing on each capacitor has a magnitude which is inversely proportional to the capacitance of each capacitor. When C4 is connected through the switching element to ground, no voltage appears on C4.

The switching element is turned off when the applied DC voltage has reached the steady state value. The radiation detector is next exposed to X-ray radiation for a given period of time. X-rays are absorbed by the photoconductive layer, producing free electron hole pairs. When the applied DC voltage is positive at the top electrode relative to the reference electrode, freed electrons migrate toward the top electrode and become trapped in the interface between the top dielectric layer 44 and the top surface of the photoconductive layer 42. similarly, freed holes migrate toward the collector electrode and are trapped at the interface between the bottom of the photoconductive layer and the insulating layer.

The trapped charges at this interface induce a negative charge in the interface between the second dielectric layer and the collector electrode, which in turn induces a balancing positive charge on the capacitor C4. Contrary to previously disclosed radiation detectors in which the photoconductive layer is placed on the collector electrodes, because of the presence of the insulating layer between the photoconductive layer and the collector electrode, no charges, whether electrons or holes, flow from the photoconductive layer to the collector electrode or from the collector electrode to the photoconductive layer.

As a result of the exposure to radiation, the radiation detector develops in the capacitor C4 an electrical charge, whose magnitude is proportional to the exposure received. (Exposure is the time integral of the intensity of the radiation impinging on the radiation detector over the time such radiation impinges on the radiation detector).

Since both sides of the photoconductive layer are not in direct contact with any electrically conductive material, no electrical charge is allowed to inject into the photoconductive layer even under substantially high electric field. This minimizes electrical noise which tends to degrade the radiation detection efficiency of the detector.

Upon termination of the exposure to radiation, no further charges are generated in the photoconductive layer. The transistor switch is activated and the charge in C4 is directed to an integrating amplifier for detection.

In the case of an imaging panel which may comprise an array of a plurality of radiation detectors to capture a complete image corresponding to the image represented by the incident radiation, each radiation detector is sampled sequentially by means well known to those skilled in the art. Typically, each radiation detector corresponds to a pixel (picture element) in the resulting image. U.S. Pat. No. 5,648,660 issued Jul. 15, 1997, to Lee et al. discloses a preferred method for such image sampling which provides improved signal to noise characteristics.

Prior to using the radiation detector for a subsequent exposure, the charges trapped in the interface between the second and third dielectric layers and the photoconductive layer must be neutralized. This is achieved by shorting the top electrode to the reference electrode and simultaneously flooding the radiation detector from both sides with visible radiation for a preset time in the manner disclosed in U.S. Pat. No. 5,563,421 issued Oct. 8, 1996, to Lee et al. This results in the generation of a flood of free charges which tend to cancel each other and the charges trapped at the dielectric layer/photoconductive layer interface. The panel is now ready for another imaging exposure.

In radiographic applications it is often desirable to capture a large size image which may be as large as 14 by 17 inches. In order to make such large image capture panels it may be commercially advantageous to combine two or more smaller panels comprising a plurality of the detectors of FIG. 1. combining such smaller panels is done in one of two ways.

Figure 4:
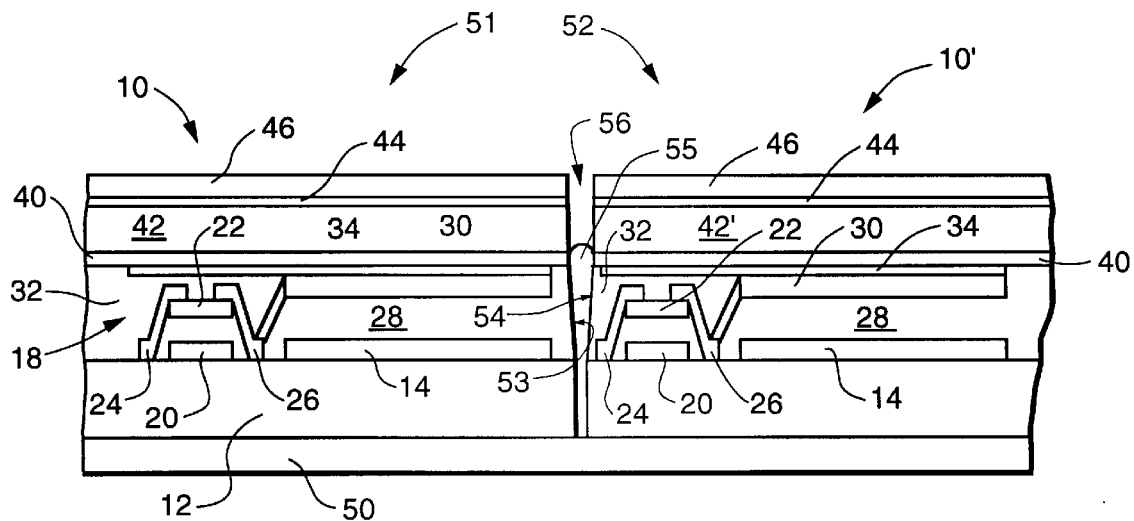
FIG. 4 is a cross-sectional elevation of the abutting portion of two smaller imaging panels forming a larger imaging panel with radiation detectors produced according to this invention.

The first, is illustrated in FIG. 4. FIG. 4 shows the last detector 10 in a first small panel and the first detector 10' in an adjoining panel, of two or more smaller panels 51 and 52 which are joined together on a support 50. The adjoining edges 53 and 54 have been prepared by grinding and polishing to a high degree of accuracy to provide optically flat and substantially perpendicular surfaces along at least one edge in each such panel. A device for polishing the edge of a panel is disclosed in Perrotto, U.S. Pat. No. 5,658,186.

The panels are next glued together with an adhesive 55 to form a larger panel.

Figure 5:
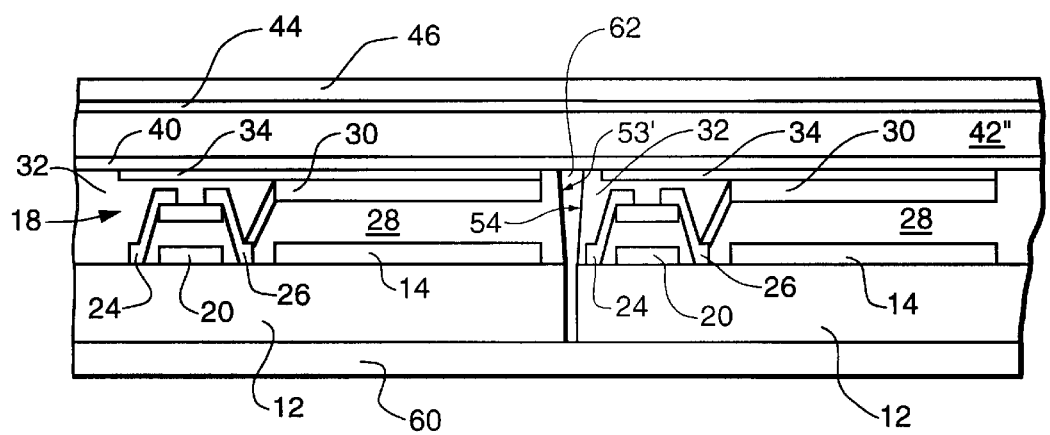
FIG. 5 is a cross-sectional elevation of the abutting portion of two smaller imaging panels forming a larger imaging panel with radiation detectors produced according to an alternate embodiment of this invention.

The second method illustrated in FIG. 5 comprises polishing and grinding again at least one side edge in each of a plurality of partially completed smaller panels. The panels prior to joining include only the transistor 18 and capacitor C4 (the reference electrode 14, the dielectric 28 and the collector electrode comprising the combination of electrodes 30 and 34), and do not include the remaining layers. These partially completed panels are juxtaposed on the top surface of a base plate 60 with the bottom surface of substrate 12 of each assembly on the base plate. The panels should be juxtaposed so that their top surfaces are substantially coplanar.

Following assembly, the insulating layer 40', the photoconductive layer 42', the top dielectric layer 44 and the top electrode layer 46, are formed on the panels.

Each of the above methods has certain advantages. In the case of the assembly of FIG. 4 which is an assembly of fully completely finished panels, it is possible to replace a damaged section by replacing the smaller panel which contains the damage. In the case of the panel with continuous insulating and photoconductive layers shown in FIG. 5, the gap 62 between the panels is typically smaller than the gap 56 in the assembly of FIG. 4 in the previous case.

The insulating layer may be placed over the collector electrode only, as shown in FIG. 1, or may be a continuous layer substantially coextensive with the photoconductive layer as shown in FIGS. 4 and 5. The insulating layer may extend only over the array detectors in each panel as shown in FIG. 4 and not bridge over across the gap between the panels assembled to form a larger panel, or may bridge the gap as shown in FIG. 5. The important consideration remains to maintain the isolation of capacitors C4 from the photoconductive layer inhibiting any direct charge between the two.

INDUSTRIAL APPLICABILITY

The invention can be used to prepare X-ray image capture panels that are useful in digital radiography. In use, a source of X-ray radiation provides a beam of x-rays. A target, i.e., a patient in the case of medical diagnostic imaging, is placed in the X-ray beam path. The X-ray radiation passing through the target is intensity modulated in an imagewise manner because of differential absorption of X-rays by various parts of the target.

When the panel is exposed to X-ray radiation, the X-ray image is captured and stored by the imaging element. The magnitude of the electrical charge at each pixel in the image is read out and stored in a computer. The data can reconstructed to form the X-ray image and, in the process, may undergo image processing, such as filtering and contrast enhancement, to facilitate interpretation of the image.

Display of the information in a display in which the geometric location of each pixel corresponds to the geometric location of the corresponding radiation detector in the panel, produces an image that represents the intensity modulation of the radiation incident on the panel. The image may be displayed on a CRT for immediate viewing or may be printed to produce a hard copy. The data may also be stored in a computer or a long term archival memory. It can also be electronically transmitted for viewing at a remote location.

Having described the invention, we now claim the following and their equivalents.

What is claimed is:

1. A radiation detector for capturing patterns of X-rays, said detector comprising:
    a dielectric substrate having a top surface and a bottom surface;
    a switching element on the top surface of said dielectric substrate;
    a charge storage capacitor also on the top surface of said dielectric substrate, said capacitor having a reference electrode, a first dielectric layer, and a collector electrode connected to said switching element, said collector electrode having a top surface opposite said dielectric substrate;
    an insulating layer having sufficient thickness to prevent any direct charge transfer between the collector electrode and the photoconductive layer, disposed on said collector electrode top surface;
    a photoconductive layer disposed on said insulator layer;
    a top dielectric layer disposed on said photoconductive layer; and
    a top conducting electrode layer disposed over said top dielectric layer.

2. The detector according to claim 1 wherein said insulating layer is coextensive with said collector electrode.

3. A radiation detector as claimed in claim 1 wherein said insulating layer and said top dielectric layer are each co-extensive extensive with the photoconductive layer.

4. A radiation detector according to claim 1 wherein said radiation detector further includes a blocking layer between said insulating layer and said top surface of the collector electrode.

5. An image detection panel comprising an array of a plurality of radiation detectors, each radiation detector comprising:
    a dielectric substrate having a top surface and a bottom surface;
    a plurality of switching elements arrayed adjacent to the top surface of said dielectric substrate;
    a plurality of charge storage capacitors also arrayed adjacent to the top surface of said dielectric substrate, each of said capacitors having a reference electrode, a first dielectric layer, and a collector electrode connected to one of said switching elements, said collector electrode having a top surface opposite said dielectric substrate;
    an insulating layer having sufficient thickness to prevent any direct charge transfer between the collector electrode and the photoconductive layer, disposed on each of said collector electrodes top surface;
    a photoconductive layer disposed on said insulator layer;
    a top dielectric layer disposed on said photoconductive layer; and
    a top conducting electrode layer disposed over said top dielectric layer.

6. An imaging panel according to claim 5 wherein said insulating layer is coextensive with said collector electrodes.

7. An image detection panel according to claim 5 wherein said insulating layer and said top dielectric layer are each co-extensive with the photoconductive layer.

8. An image detection panel according to claim 7 wherein the insulating layer is Silicon Dioxide ($SiO_2$) and has a thickness of between about 200 Å and 1000 Å.

9. An image detection panel according to claim 7 further comprising a charge blocking layer between said insulating layer and said top surface of the collector electrode.

10. An image detection panel according to claim 6 wherein the array of the plurality of detectors comprises an assembly of a plurality of smaller detector arrays.

11. An image detection panel according to claim 10 wherein the insulating layer extends over the plurality of smaller arrays in a continuous layer.

* * * * *